US012063841B2

(12) United States Patent
Shi et al.

(10) Patent No.: US 12,063,841 B2
(45) Date of Patent: Aug. 13, 2024

(54) DISPLAY PANEL AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Shi, Beijing (CN); Weiyun Huang, Beijing (CN); Yuanming Feng, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 421 days.

(21) Appl. No.: 17/636,556

(22) PCT Filed: Mar. 24, 2021

(86) PCT No.: PCT/CN2021/082849
§ 371 (c)(1),
(2) Date: Feb. 18, 2022

(87) PCT Pub. No.: WO2022/198533
PCT Pub. Date: Sep. 29, 2022

(65) Prior Publication Data
US 2023/0354675 A1    Nov. 2, 2023

(51) Int. Cl.
*H10K 59/80* (2023.01)
*H10K 59/12* (2023.01)
(Continued)

(52) U.S. Cl.
CPC ... *H10K 59/80517* (2023.02); *H10K 59/1201* (2023.02); *H10K 59/121* (2023.02);
(Continued)

(58) Field of Classification Search
CPC ........ H10K 59/80517; H10K 59/1201; H10K 59/121; H10K 59/122; H10K 59/65;
(Continued)

(56) References Cited

U.S. PATENT DOCUMENTS 8,018,141 B2 * 9/2011 Kim .................. H10K 50/81
313/506
8,822,998 B2 * 9/2014 Kim .................. H10K 59/121
313/506
(Continued)

FOREIGN PATENT DOCUMENTS

CN      101847601 A    9/2010
CN      109216581 A    1/2019
(Continued)

*Primary Examiner* — Caleb E Henry
(74) *Attorney, Agent, or Firm* — The Webb Law Firm

(57) ABSTRACT

A display panel and a manufacturing method thereof, and a display device. The display panel includes a display area including a first and a second display area. The display panel includes: a base substrate; a driving circuit layer; anode structures located at the first display area, a gap being provided between adjacent anode structures, at least one anode structure including a functional layer and a first anode and an orthographic projection of the functional layer includes a portion not overlapped with an orthographic projection of the first anode; and a pixel defining layer including a pixel defining portion located in the gap. −0.1 microns≤d1−d2≤0.1 microns, wherein d1 is a thickness of the functional layer, $$d2 = \frac{\lambda(2m+1)}{2|n1-n2|},$$

(Continued)

n1 and n2 are refractive indexes of the functional layer and the pixel defining portion respectively, $\lambda$ is a wavelength of visible light, and m is an integer.

20 Claims, 6 Drawing Sheets

(51) Int. Cl.
    *H10K 59/121*     (2023.01)
    *H10K 59/122*     (2023.01)
    *H10K 59/65*     (2023.01)
    *H10K 71/00*     (2023.01)
    *H10K 102/00*     (2023.01)

(52) U.S. Cl.
    CPC ........... *H10K 59/122* (2023.02); *H10K 59/65* (2023.02); *H10K 71/00* (2023.02); *H10K 2102/351* (2023.02)

(58) Field of Classification Search
    CPC ............. H10K 71/00; H10K 2102/351; H10K 59/80518; H10K 59/8051; H01L 27/3246; H01L 51/5056; H01L 51/5072; H01L 51/5092; H01L 51/56; H01L 2227/323; H01L 27/3244; H01L 51/5088; H01L 21/77
    See application file for complete search history.

(56) References Cited

U.S. PATENT DOCUMENTS

| | | | | |
|---|---|---|---|---|
| 9,324,947 | B2* | 4/2016 | Sato | H10K 50/8423 |
| 9,614,015 | B2* | 4/2017 | Park | H10K 59/122 |
| 9,716,208 | B2* | 7/2017 | Dozen | H10K 59/122 |
| 10,916,723 | B2* | 2/2021 | Lee | H10K 50/84 |
| 2004/0228964 | A1* | 11/2004 | Ito | H10K 71/135 |
| | | | | 427/256 |
| 2006/0097263 | A1* | 5/2006 | Lee | H10K 59/122 |
| | | | | 257/72 |
| 2007/0159089 | A1* | 7/2007 | Oh | H10K 59/122 |
| | | | | 313/506 |
| 2009/0128020 | A1* | 5/2009 | Takei | H10K 59/12 |
| | | | | 313/504 |
| 2010/0181559 | A1* | 7/2010 | Nakatani | H10K 59/122 |
| | | | | 438/34 |
| 2010/0248403 | A1 | 9/2010 | Hatano et al. | |
| 2011/0233572 | A1* | 9/2011 | Nakatani | H10K 59/122 |
| | | | | 257/88 |
| 2011/0260955 | A1* | 10/2011 | Yoshida | H10K 59/122 |
| | | | | 345/76 |
| 2013/0099221 | A1* | 4/2013 | Kawamura | H10K 50/80 |
| | | | | 438/34 |
| 2013/0234126 | A1* | 9/2013 | Nakatani | H10K 59/122 |
| | | | | 438/34 |
| 2014/0159074 | A1* | 6/2014 | Isobe | H10K 50/844 |
| | | | | 438/34 |
| 2015/0171327 | A1* | 6/2015 | Matsushima | H10K 71/00 |
| | | | | 438/35 |
| 2016/0093680 | A1* | 3/2016 | Paek | H10K 50/805 |
| | | | | 438/34 |
| 2018/0190190 | A1* | 7/2018 | Xi | G09G 3/3208 |
| 2018/0254303 | A1* | 9/2018 | Mishima | H10K 50/852 |
| 2019/0013495 | A1 | 1/2019 | Kim et al. | |
| 2020/0006661 | A1* | 1/2020 | Shinokawa | B23K 26/0876 |
| 2020/0194513 | A1* | 6/2020 | Kim | H10K 50/16 |
| 2020/0227661 | A1* | 7/2020 | Nishikiori | H10K 71/00 |
| 2020/0293739 | A1* | 9/2020 | Yang | H10K 59/126 |
| 2021/0183972 | A1* | 6/2021 | Son | H10K 71/00 |
| 2021/0367013 | A1 | 11/2021 | Yuan et al. | |

FOREIGN PATENT DOCUMENTS

| | | |
|---|---|---|
| CN | 110048005 A | 7/2019 |
| CN | 210668382 U | 6/2020 |
| CN | 111584754 A | 8/2020 |
| WO | 2020155127 A | 8/2020 |

* cited by examiner

DISPLAY PANEL AND MANUFACTURING METHOD THEREOF, AND DISPLAY DEVICE

CROSS-REFERENCE TO RELATED APPLICATION

This application is a United States National Stage Application under 35 U.S.C. § 371 of International Patent Application No. PCT/CN2021/082849, filed on Mar. 24, 2021, the disclosure of which is hereby incorporated by reference in its entirety.

TECHNICAL FIELD

The present disclosure relates to a display panel and a manufacturing method thereof, and a display device.

BACKGROUND

With the development of display technology, the under-screen camera display technology is gradually applied to obtain a greater screen-to-body ratio.

SUMMARY

According to one aspect of embodiments of the present disclosure, a display panel is provided. The display panel comprises a display area, wherein the display area comprises a first display area and a second display area other than the first display area, and a transmittance of the first display area is smaller than that of the second display area, the display panel comprising: a base substrate; a driving circuit layer located on one side of the base substrate and located at the first display area and the second display area; a plurality of anode structures located at the first display area, wherein a gap is provided between adjacent anode structures of the plurality of anode structures, and at least one of the plurality of anode structures comprises: a functional layer located on one side of the driving circuit layer away from the base substrate, and a first anode located on one side of the functional layer away from the base substrate, wherein a first orthographic projection of the functional layer on the base substrate comprises a portion that does not overlap with a second orthographic projection of the first anode on the base substrate; and a pixel defining layer located on one side of the driving circuit layer away from the base substrate, and comprising a pixel defining portion located in the gap, wherein: −0.1 microns≤d1−d2≤0.1 microns, wherein d1 is a thickness of the functional layer, and $$d2 = \frac{\lambda(2m+1)}{2|n1-n2|},$$

wherein n1 is a refractive index of the functional layer, n2 is a refractive index of the pixel defining portion, |n1−n2| is an absolute value of (n1−n2), λ is a wavelength of visible light, and m is an integer.

In some embodiments, the second orthographic projection is within the first orthographic projection.

In some embodiments, the functional layer comprises a first surface away from the base substrate, a second surface close to the base substrate, and a third surface adjacent to the first surface and the second surface; and the pixel defining portion is in contact with at least a part of an area of the first surface not covered by the first anode, and in contact with the third surface.

In some embodiments, λ ranges from 500 nanometers to 600 nanometers.

In some embodiments, λ=550 nanometers.

In some embodiments, m=0.

In some embodiments, the functional layer has a thickness of 0.2 microns to 5 microns.

In some embodiments, a minimum distance between an edge of the second orthographic projection and an edge of the first orthographic projection is 1 micron to 3 microns.

In some embodiments, a shape of the second orthographic projection is the same as that of the first orthographic projection.

In some embodiments, |n1−n2| is greater than or equal to 0.15.

In some embodiments, an extinction coefficient of the functional layer is k, where 0≤k≤0.5.

In some embodiments, 0≤k≤0.1.

In some embodiments, d1=d2.

In some embodiments, a material of the functional layer comprises a silicon nitride, a carbazole compound, an organic amine compound, or a butadiene compound.

In some embodiments, the silicon nitride comprises $SiN_x$.

In some embodiments, the first anode is opaque.

In some embodiments, the first anode comprises a stack comprising a first layer, a second layer, and a third layer located between the first layer and the second layer, and a material of each of the first layer, the second layer, and the third layer comprises a metal or a metal oxide.

In some embodiments, the display panel further comprises: a plurality of second anodes located at the second display area and in contact with a planarization layer in the driving circuit layer.

In some embodiments, the driving circuit layer comprises: a pixel driving circuit connected to the first anode and located at the second display area.

According to another aspect of embodiments of the present disclosure, a display device is provided. The display device comprises: the display panel according to any one of the above-described embodiments; and a camera located on one side of the base substrate away from the driving circuit layer, wherein an orthographic projection of the camera on the base substrate at least partially overlaps with the first display area.

According to further aspect of embodiments of the present disclosure, a manufacturing method of a display panel is provided, wherein the display panel comprises a display area comprising a first display area and a second display area other than the first display area, and a transmittance of the first display area is smaller than that of the second display area, the manufacturing method comprising: providing a base substrate; forming a driving circuit layer located at the first display area and the second display area on one side of the base substrate; forming a plurality of anode structures located at the first display area, wherein a gap is provided between adjacent anode structures of the plurality of anode structures, wherein forming at least one of the plurality of anode structures comprises: forming a functional layer on one side of the driving circuit layer away from the base substrate, and forming a first anode on one side of the functional layer away from the base substrate, wherein a first orthographic projection of the functional layer on the base substrate comprises a portion that does not overlap with a second orthographic projection of the first anode on the base substrate; and forming a pixel defining layer on one side of the driving circuit layer away from the base substrate, wherein the pixel defining layer comprises a pixel defining portion located in the gap, wherein: −0.1 microns≤d1−d2≤0.1 microns, wherein d1 is a thickness of the functional layer, and $$d2 = \frac{\lambda(2m+1)}{2|n1-n2|},$$

wherein n1 is a refractive index of the functional layer, n2 is a refractive index of the pixel defining portion, |n1−n21 is an absolute value of (n1−n2), λ is a wavelength of visible light, and m is an integer.

BRIEF DESCRIPTION OF THE ACCOMPANYING DRAWINGS

The accompanying drawings which constitute part of this specification, describe embodiments of the present disclosure, and together with this specification, serve to explain the principles of the present disclosure.

The present disclosure may be more explicitly understood from the following detailed description with reference to the accompanying drawings, in which.

It should be understood that dimensions of various parts shown in the accompanying drawings are not necessarily drawn according to actual proportional relations. In addition, the same or similar members are denoted by the same or similar reference numerals.

DETAILED DESCRIPTION

Figure 1A:
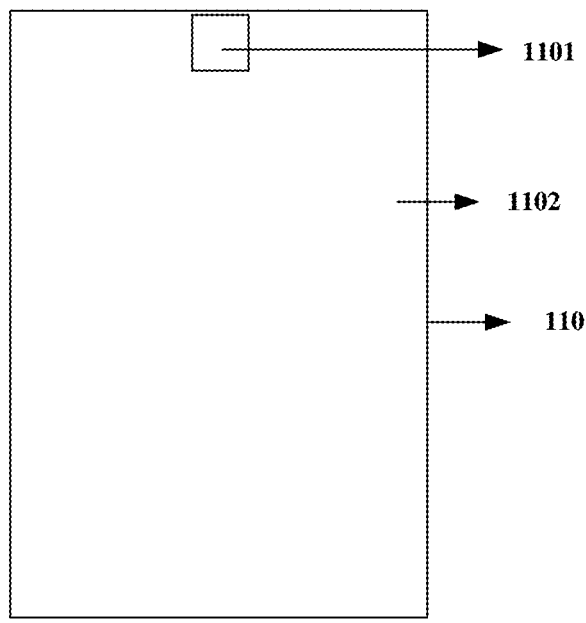
FIG. 1A is a schematic top view showing a display panel according to an embodiment of the present disclosure.

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and device known to those of ordinary skill in the relevant art may not be discussed in detail, but where appropriate, these techniques, methods, and devices should be considered as part of this specification.

In the related art, in order to allow normal display of an area of the display panel corresponding to the camera, this area of the display panel may still be provided with a light-emitting device. The inventors have noticed that a gap is provided between the first anodes in different light-emitting devices, which is equivalent to that a grating is provided in front of the camera. When light passes through this area of the display panel, a diffraction will occur at an edge of the first anode, which results in a reduced imaging resolution, thus the image finally obtained has glare.

In view of the above, embodiments of the present disclosure propose the following technical solutions.

FIG. 1A is a schematic top view showing the display panel according to an embodiment of the present disclosure.

Figure 1B:
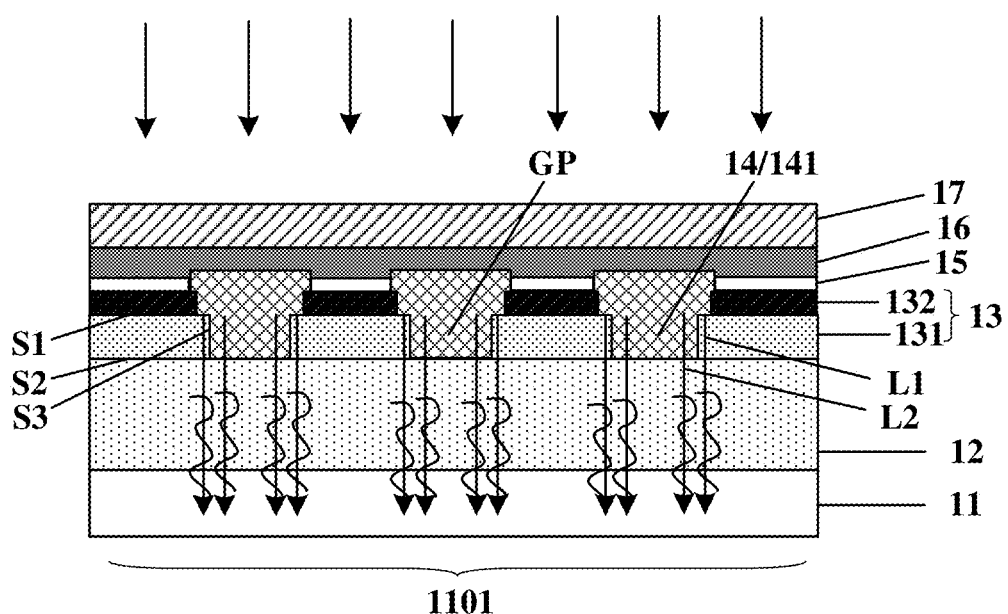
FIG. 1B is a schematic cross-sectional view showing a display panel according to an embodiment of the present disclosure.

FIG. 1B is a schematic cross-sectional view showing the display panel according to an embodiment of the present disclosure.

The display panel according to some embodiments of the present disclosure will be introduced below in conjunction with FIG. 1A and FIG. 1B.

As shown in FIG. 1A, the display panel comprises a display area 110. Here, the display area 110 comprises a first display area 1101 and a second display area 1102 other than the first display area 1101. In other words, the area of the display area 110 other than the first display area 1101 is referred to as the second display area 1102. The transmittance of the first display area 1101 is smaller than that of the second display area 1102. The quantity of the first display area 1101 may be one or more than one. The shape of the first display area 1101 may be, for example, a square, a circle, or the like. In some embodiments, the second display area 1102 may completely surround the first display area 1101. In other embodiments, the second display area 1102 may partially surround the first display area 1101, that is, a portion of the edge of the first display area 1101 overlaps with a portion of the edge of the display area 111.

It can be understood that, in some embodiments, the display panel may further comprise a peripheral area surrounding the display area 110 (not shown in FIG. 1A).

As shown in FIG. 1B, the display panel comprises a base substrate 11, a driving circuit layer 12, a plurality of anode structures 13 and a pixel defining layer 14.

In some embodiments, the base substrate 11 may comprise a flexible substrate. For example, the material of the base substrate 11 may comprise an organic material such as polyimide (PI).

The driving circuit layer 12 is located on one side of the base substrate 11 and located at the first display area 1101 and the second display area 1102. In other words, the first display area 1101 and the second display area 1102 both comprise the driving circuit layer 12. For example, the driving circuit layer 12 may comprise a pixel driving circuit and a planarization layer covering the pixel driving circuit.

The plurality of anode structures 13 is located at the first display area 1101. A gap GP is provided between adjacent anode structures 13 of the plurality of anode structures 13. At least one of the plurality of anode structures 13 comprises a functional layer 131 and a first anode 132. For example, some of the plurality of anode structures 13 comprise the functional layer 131 and the first anode 132, while other anode structures 13 only comprise the first anode 132 but do not comprise the functional layer 131. For further example, each of the plurality of anode structures 13 comprises the functional layer 131 and the first anode 132.

The functional layer 131 is located on one side of the driving circuit layer 12 away from the base substrate 11, and the first anode 132 is located on one side of the functional layer 131 away from the base substrate 11. Here, a first orthographic projection 131' of the functional layer 131 on the base substrate 11 comprises a portion that does not overlap with a second orthographic projection 132' of the first anode 132 on the base substrate 11, which will be introduced hereinafter in conjunction with FIG. 1C and FIG. 1D. That is, a part of the first orthographic projection 131' overlaps with the second orthographic projection 132', and the other part of the first orthographic projection 131' does not overlap with the second orthographic projection 132'. In other words, the first orthographic projection 131' comprises a portion outside the second orthographic projection 132', while the second orthographic projection 132' is at least partially within the first orthographic projection 131'.

The pixel defining layer 14 is located on one side of the driving circuit layer 12 away from the base substrate 11. The pixel defining layer 14 comprises a pixel defining portion 141 located in the gap GP. In other words, the portion of the pixel defining layer 14 located in the gap GP is referred to as the pixel defining portion 141. In some embodiments, the pixel defining portion 141 is in contact with the functional layer 131. For example, the material of the pixel definition layer 14 may be polyimide, acrylic or polyethylene terephthalate, or the like.

For ease of description, the thickness of the functional layer 131 is defined as d1, and it is defined that $$d2 = \frac{\lambda(2m+1)}{2|n1-n2|}.$$

Here, d1 and d2 satisfy the following relationship: −0.1 microns≤d1−d2≤0.1 microns. n1 is the refractive index of the functional layer 131, n2 is the refractive index of the pixel defining portion 141, |n1−n21 is the absolute value of (n1−n2), λ is the wavelength of visible light, and m is an integer.

It can be understood that in a case where d1 is equal to d2, light L1 transmitted through the functional layer 131 from the edge of the first anode 132 and a part of light L2 transmitted through the pixel defining portion 141 satisfy the destructive interference condition. Therefore, the light L1 and the light L2 can fully destructive interference without being incident to the base substrate 11. In a case where −0.1 microns≤d1−d2≤0.1 microns, the light L1 and the light L2 at least partially destructive interference, thus the diffraction of light transmitted from the edge of the first anode 132 can be at least reduced.

In the above-described embodiments, −0.1 microns≤d1−d2≤0.1 microns. The diffraction of external light transmitted through the gap GP between adjacent first anodes 132 is at least reduced, which helps to improve the imaging resolution of light, thereby alleviating the problem of glare in camera imaging and improving the quality of the camera imaging.

It can be understood that, in addition to the components described above, the display panel may also comprise other components, for example, a light-emitting layer 15 located on one side of each first anode 132 away from the base substrate 11, a cathode 16 located on one side of the light-emitting layer 15 away from the base substrate 11, and an encapsulation layer 17 located on one side of the cathode 16 away from the base substrate 11. The light-emitting layer 15 comprises, for example, at least an organic light-emitting material layer. In some embodiments, the light-emitting layer 15 may further comprise one or more of an electron transport layer, an electron injection layer, a hole transport layer, and a hole injection layer. The encapsulation layer 17 may comprise a thin film encapsulation layer.

According to one or more embodiments of the present disclosure, referring to FIG. 1B, the functional layer 131 comprises a first surface S1 away from the base substrate 11, a second surface S2 close to the base substrate 11, and a third surface S3 adjacent to each of the first surface S1 and the second surface S2. The pixel defining portion 141 is in contact with at least a part of an area of the first surface S1 that is not covered by the first anode 132, and in contact with the third surface S3. In other words, the pixel defining portion 141 fills up the gap GP.

Figure 1C:
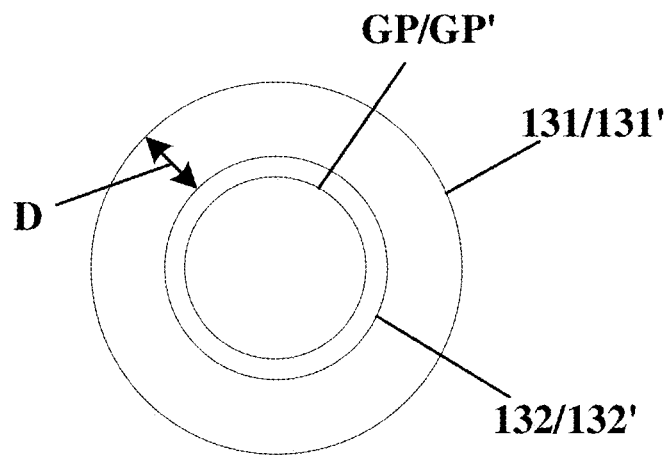
FIG. 1C is a schematic view showing a first orthographic projection and a second orthographic projection according to an embodiment of the present disclosure.
Figure 1D:
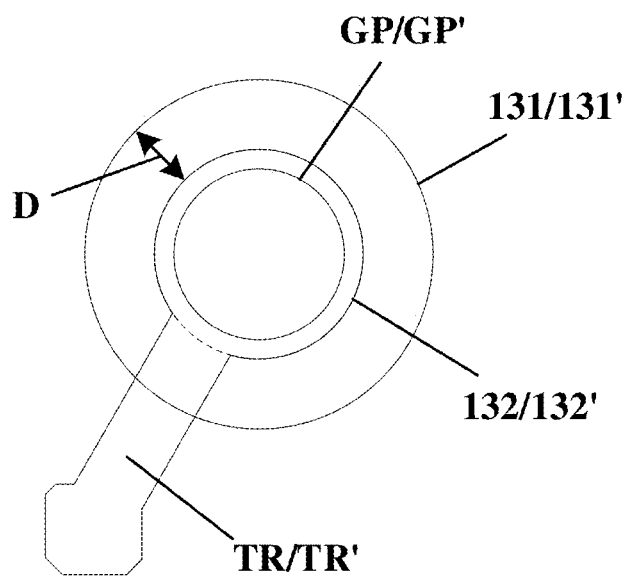
FIG. 1D is a schematic view showing a first orthographic projection and a second orthographic projection according to another embodiment of the present disclosure.

FIG. 1C is a schematic view showing a first orthographic projection and a second orthographic projection according to an embodiment of the present disclosure. FIG. 1D is a schematic view showing a first orthographic projection and a second orthographic projection according to another embodiment of the present disclosure. It should be noted that FIG. 1C and FIG. 1D also show the pixel defining portion GP and the orthographic projection GP' of the pixel defining portion GP on the base substrate 11.

As shown in FIG. 1C and FIG. 1D, a portion of the first orthographic projection 131' of the functional layer 131 on the base substrate 11 does not overlap with the second orthographic projection 132' of the first anode 132 on the base substrate 11.

In one or more embodiments, as shown in FIG. 1D, the display panel further comprises an anode trace TR integrally provided with the first anode 132. For example, a pixel driving circuit may be connected to the anode trace TR via a via hole, thereby realizing the connection between the pixel driving circuit and the first anode 132. For example, if the first anode 132 and the anode trace TR are viewed as an overall structure, a part of the overall structure with a contour similar to that of the pixel defining portion GP may be regarded as the first anode 132, and the remaining part of the overall structure may be regarded as the anode trace TR. Similarly, if the second orthographic projection 132' of the first anode 132 on the base substrate 11 and the orthographic projection TR' of the anode trace TR on the base substrate 11 are viewed as an overall projection, a part of the overall projection with a contour similar to that of the orthographic projection GP' of the pixel defining portion GP on the base substrate 11 may be regarded as the second orthographic projection 132', and the remaining part of the overall projection may be regarded as the orthographic projection TR'.

In some embodiments, as shown in FIG. 1C and FIG. 1D, the second orthographic projection 132' is within the first orthographic projection 131'. In this way, the diffraction of external light transmitted through the gap GP between adjacent first anodes 132 can be further reduced, thereby helping to further improve the imaging resolution of light, and further alleviating the problem of glare in the image.

It can be understood that, in FIG. 1D, a part of the orthographic projection TR' overlaps with the orthographic projection 131', and the other part of the orthographic projection TR' is outside the orthographic projection 131'.

In some embodiments, the minimum distance D between an edge of the second orthographic projection 132' and an edge of the first orthographic projection 131' is 1 micron to 3 microns, for example, is 1 micron, 1.5 microns, 2 microns, 3 microns, etc. The inventors have noticed that, in a case where the minimum distance D is greater than 3 microns, the effect of reducing the diffraction is no longer apparent. Therefore, in a case where the distance D is in this range, the process difficulty and the effect of reducing the diffraction can be balanced.

It should be understood that there is a plurality of distances between a plurality of first points on the edge of the second orthographic projection 132' and a plurality of second points on the edge of the first orthographic projection 131'. The minimum distance D between the edge of the second orthographic projection 132' and the edge of the first orthographic projection 131' is the minimum value of the plurality of distances.

In some embodiments, the shape of the second orthographic projection 132' is the same as that of the first orthographic projection 131'. As some implementations, the shapes of the second orthographic projection 132' and the first orthographic projection 131' are two concentric circles. It can be understood that, in this case, the distance between the two concentric circles is 1 micron to 3 microns. In some embodiments, the first anode 132 is opaque. For example, the first anode 132 may comprise a stack. Some implementations of the first anode will be introduced below in conjunction with FIG. 2.

Figure 2:
FIG. 2 is a schematic cross-sectional view showing a first anode according to an embodiment of the present disclosure.

FIG. 2 is a schematic cross-sectional view showing the first anode according to an embodiment of the present disclosure.

As shown in FIG. 2, the stack of the first anode 132 comprises a first layer 1321, a second layer 1322, and a third layer 1323 located between the first layer 1321 and the second layer 1322. For example, the material of one of the first layer 1321, the second layer 1322, and the third layer 1323 may comprise a metal or a metal oxide. As some examples, the material of the metal oxide may comprise indium tin oxide (ITO) and the like. As some examples, the material of the metal may comprise silver (Ag).

In some embodiments, the material of the first layer 1321 and the material of the second layer 1322 are the same, for example, each comprises ITO; and the material of the third layer 1322 comprises Ag. For example, the stack of the first anode 132 may be ITO/Ag/ITO.

It should be noted that within the wavelength range of visible light, in a case where λ has different values, embodiments of the present disclosure can reduce the diffraction of visible light of different wavelengths.

In some embodiments, the above-described λ in d2 ranges from 500 nanometers to 600 nanometers, for example, is 520 nanometers, 540 nanometers, 560 nanometers, etc. Since the human eye is more sensitive to light with wavelength ranging from 550 nm to 600 nm, the diffraction of light with wavelength ranging from 500 nm to 600 nm transmitted through the gap GP between adjacent first anodes 132 can be reduced, thereby helping to further alleviate the problem of glare in camera imaging, and further improving the quality of the camera imaging.

In some embodiments, the above-described λ in d2 is 550 nanometers. Since the human eye is most sensitive to light with wavelength of 550 nanometers, the diffraction of light with wavelength of 550 nanometers transmitted through the gap GP between adjacent first anodes 132 can be reduced, thereby helping to further alleviate the problem of glare in camera imaging, and further improving the quality of the camera imaging.

In a case where the display panel comprises the functional layer 131, the thickness of the display panel will increase. On the premise of alleviating the problem of glare in camera imaging, in order to avoid an excessive thickness of the display panel, the following solutions are also provided in embodiments of the present disclosure.

In some embodiments, m in above-described d2 is 0. In this way, it helps to reduce the thickness of the functional layer 131. Accordingly, the thickness of the display panel can be reduced under the premise of alleviating the problem of glare in camera imaging.

In other embodiments, the absolute value |n1−n2| of the difference between the refractive index n1 of the functional layer 131 and the refractive index n2 of the pixel defining portion 141 is greater than or equal to 0.15, for example, 0.2, 0.4, 0.5, etc. In this way, it helps to reduce the thickness of the functional layer 131. Accordingly, the thickness of the display panel can be reduced under the premise of alleviating the problem of glare in camera imaging.

In further embodiments, m in above-described d2 is 0, and the absolute value |n1−n2| of the difference between the refractive index n1 of the functional layer 131 and the refractive index n2 of the pixel defining portion 141 is greater than or equal to 0.15. In this way, it helps to further reduce the thickness of the functional layer 131. Accordingly, the thickness of the display panel can be further reduced under the premise of alleviating the problem of glare in camera imaging.

According to some embodiments of the present disclosure, the thickness of the functional layer 131 is 0.2 microns to 5 microns, for example, 0.3 microns, 0.4 microns, etc.

The functional layer 131 may be implemented in different ways, and some specific implementations of the functional layer 131 will be introduced below.

As some implementations, the material of the functional layer 131 comprises silicon nitride. For example, the silicon nitride may comprise $SiN_x$. It should be understood that x in $SiN_x$ is greater than zero. In some embodiments, the refractive index n1 of $SiN_x$ is 1.903, the refractive index of the pixel defining portion 141 is 1.658, and the thickness of $SiN_x$ is 0.9 microns to 1 micron.

As other implementations, the material of the functional layer 131 comprises a material that can serve as the hole transport layer of the light-emitting device. In some embodiments, the functional layer 131 comprises a carbazole compound, an organic amine compound, or a butadiene compound, for example, N,N'-diphenyl-N,N'-(1-naphthyl)-1,1'-biphenyl-4,4'-diamine (molecular formula: C44H32N2, referred to as NPB), 4,4'-cyclohexylbis [N,N-bis(4-methylphenyl)aniline] (molecular formula: C46H46N2, referred to as TAPC), polyvinylcarbazole (PVK), and total petroleum hydrocarbon (TPH). In some embodiments, the refractive index n1 of the hole transport layer is 1.9153, the refractive index of the pixel defining portion 141 is 1.658, and the thickness of the hole transport layer is 0.8 microns to 0.9 microns.

In some embodiments, the extinction coefficient of the functional layer 131 is k, and $0 \le k \le 0.5$. For example, k=0.1, 0.2, or 0.3. In this way, the light transmittance of the area of the display panel corresponding to the first display area 1101 can be improved.

In some embodiments, $0 \le k \le 0.1$. For example, k=0.03, 0.05, or 0.08. In this way, the light transmittance of the area of the display panel corresponding to the first display area 1101 can be further improved.

Figure 3A:
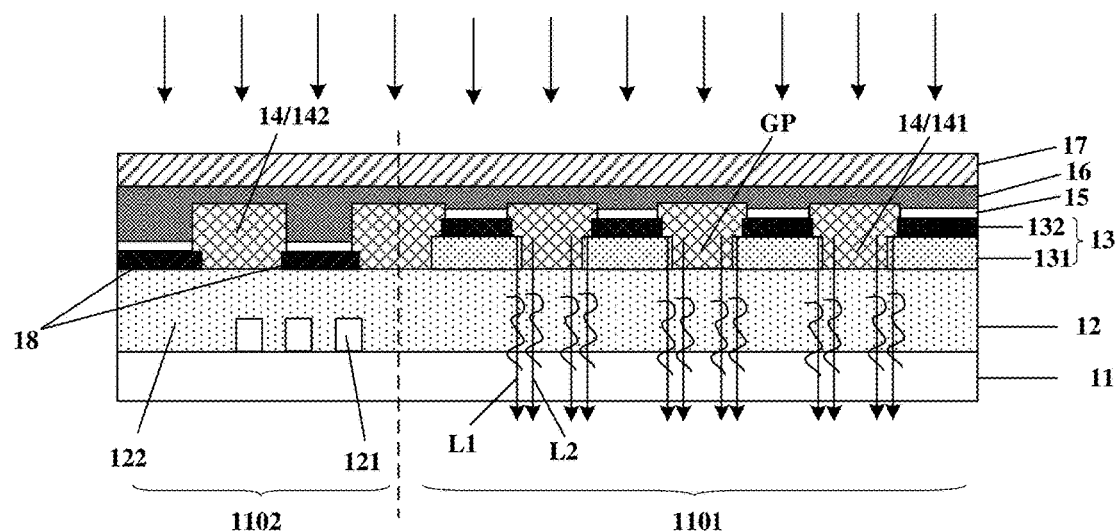
FIG. 3A is a schematic cross-sectional view showing a display panel according to another embodiment of the present disclosure.

FIG. 3A is a schematic cross-sectional view showing a display panel according to another embodiment of the present disclosure.

As shown in FIG. 3A, the display panel further comprises a plurality of second anodes 18 located at the second display area 1102. Here, the plurality of second anodes 18 is in contact with the planarization layer 122 in the driving circuit layer 12. With such a structure, the functional layer 131 is provided only in the first display area 1101 rather than in the entire display area 110, which can simplify the manufacturing process of the display panel.

Here, FIG. 3A also shows the pixel defining portion 142 of the pixel defining layer 14 located at the second display area 1102. The pixel defining portion 142 is located between adjacent second anodes 18.

In some embodiments, as shown in FIG. 3A, the driving circuit layer 12 comprises a pixel driving circuit 121 connected to the first anode 132. The pixel driving circuit 121 can drive a light-emitting device located at the first display area 1101 to emit light. Here, the pixel driving circuit 121 is located at the second display area 1102. For example, the pixel driving circuit 121 may be connected to one or more first anodes 132, so as to drive one or more light-emitting devices located at the first display area 1101 to emit light.

As some implementations, the pixel driving circuit 121 may comprise two thin film transistors and one capacitor (2T1C), six thin film transistors and one capacitor (6T1C), or seven thin film transistors and one capacitor (7T1C). For example, an active layer of each thin film transistor may comprise low temperature polysilicon (LTPS) or oxide semiconductor.

In the above embodiments, the pixel driving circuit 121 connected to the first anode 132 is located at the second display area 1102 rather than the first display area 1101. Accordingly, the light transmittance of the area of the display panel corresponding to the first display area 1101 can be increased and the adverse effect of the pixel driving circuit 121 on camera imaging is avoided.

It can be understood that the driving circuit layer 12 may also comprise other pixel driving circuits (not shown) connected to the second anodes 18 and located at the second display area 1102. These pixel driving circuits can drive the light-emitting devices located at the second display area 1102 to emit light.

Figure 3B:
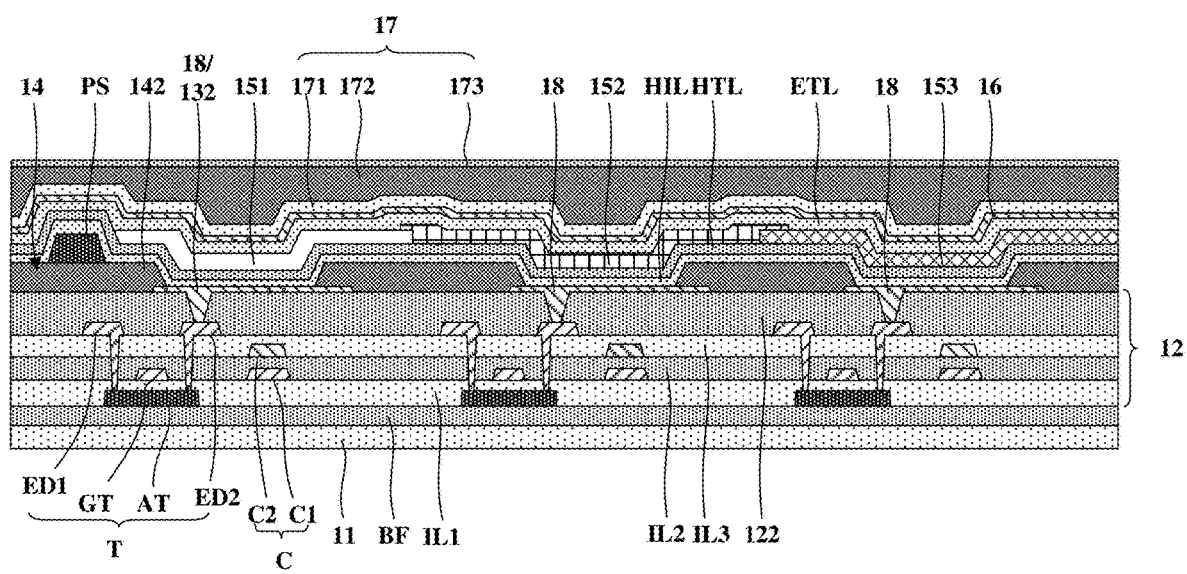
FIG. 3B is a schematic cross-sectional view showing a display panel according to further embodiment of the present disclosure.

FIG. 3B is a schematic cross-sectional view showing a display panel according to further embodiment of the present disclosure.

As shown in FIG. 3B, the pixel driving circuit in the driving circuit layer 12 may comprise a thin film transistor T and a capacitor C. It should be understood that the pixel driving circuit may also comprise other thin film transistors.

The thin film transistor T comprises an active layer AT on one side of the base substrate 11, a first insulating layer IL1 on one side of the active layer AT away from the base substrate 11, a gate GT on one side of the first insulating layer IL1 away from the base substrate 11, and a first electrode ED1 and a second electrode ED2 which penetrate through a second insulating layer IL2 and a third insulating layer IL3. Here, the second insulating layer IL2 is located on one side of the gate GT away from the base substrate 11, and the third insulating layer IL3 is located on one side of the second insulating layer IL2 away from the base substrate 11. For example, the material of the active layer AT may comprise one or more of amorphous indium gallium zinc oxide (a-IGZO), zinc oxynitride (ZnON), indium zinc tin oxide (IZTO), amorphous silicon (a-Si), polysilicon (p-Si), sexithiophene and polythiophene. For example, the material of each of the first insulating layer IL1, the second insulating layer IL2, the third insulating layer IL3, and the fourth insulating layer IL4 may comprise one or more of silicon oxide, silicon nitride, and silicon oxynitride. As some implementations, the material of at least one of the first electrode ED1 or the second electrode ED1 may comprise a metal or an alloy. Examples of the metal may comprise one or more of silver (Ag), copper (Cu), aluminum (Al), titanium (Ti), and molybdenum (Mo). Examples of the alloy comprise aluminum neodymium alloy (AlNd) or molybdenum niobium alloy (MoNb). For example, the first electrode ED1 and the second electrode ED1 may have a single-layer structure or a multi-layer structure, for example, Ti/Al/Ti, etc.

The capacitor C comprises a first electrode plate C1 between the first insulating layer IL1 and the second insulating layer IL2, and a second electrode plate C2 located between the second insulating layer IL2 and the third insulating layer IL3. It should be understood that the capacitor C further comprises the second insulating layer IL2 located between the first electrode plate C1 and the second electrode plate C2. The planarization layer 122 covers the first electrode ED1 and the second electrode ED2. For example, the first electrode plate C1 and the gate GT may be located at a same layer, that is, formed by patterning a same material layer. As some implementations, the material of at least one of the first electrode plate C1 or the second electrode plate C2 may comprise the metal described above or the alloy described above.

The second anode 18 may be connected to the second electrode ED2 of the thin film transistor T in the corresponding pixel driving circuit through a via hole penetrating through the planarization layer 122. Similarly, the first anode 132 may also be connected to the second electrode ED2 of the thin film transistor T in the corresponding pixel driving circuit through a via hole penetrating through the planarization layer 122. For example, the anode trace TR integrally provided with the first anode 132 is connected to the second electrode ED2 of the thin film transistor T through a via hole penetrating through the planarization layer 122.

FIG. 3B also shows a spacer PS located on one side of the pixel definition layer 14 away from the base substrate. The spacer PS is configured to support a mask, for example a fine metal mask (FMM). In some examples, the spacer PS may be located between a red sub-pixel and a blue sub-pixel adjacent to the red sub-pixel.

In some embodiments, the display panel may further comprise a buffer layer BF located between the base substrate 11 and the active layer AT. The buffer layer BF is used for improving the water and oxygen resistance of the base substrate 11. For example, the buffer layer BF may block water vapor and oxygen from entering the active layer AT.

In some embodiments, as shown in FIG. 3B, the light-emitting layer 15 may comprise a first light-emitting layer 151, a second light-emitting layer 152, and a third light-emitting layer 153. Here, the first light-emitting layer 151, the second light-emitting layer 152, and the third light-emitting layer 153 are light-emitting devices of three sub-pixels (for example, a red sub-pixel, a green sub-pixel, and a blue sub-pixel), respectively. The light-emitting device of each sub-pixel may further comprise one or more of a hole injection layer HIL, a hole transport layer HTL, and an electron transport layer ETL. For example, the hole injection layer HIL, the hole transport layer HTL, and the electron transport layer ETL are shared by different sub-pixels.

It should be noted that although two adjacent layers of the first light-emitting layer 151, the second light-emitting layer 152, and the third light-emitting layer 153 shown in FIG. 3B may overlap, this is not restrictive. In other embodiments, the first light-emitting layer 151, the second light-emitting layer 152, and the third light-emitting layer 153 may not overlap with each other.

In some embodiments, referring to FIG. 3B, the encapsulation layer 17 may comprise a first inorganic layer 171, a second inorganic layer 172, and an organic layer 173 located between the first inorganic layer 171 and the second inorganic layer 172. In other embodiments, the encapsulation layer 17 may further comprise more layers, for example, may comprise another organic layer located on one side of the second inorganic layer 172 away from the base substrate 11, and a third inorganic layer on one side of this another organic layer away from the base substrate 11.

Figure 4A:
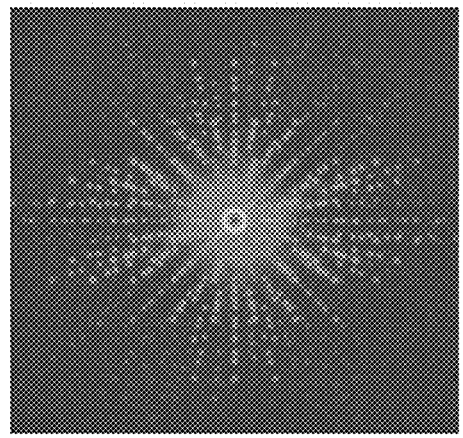
FIG. 4A is a schematic view showing the simulation of a point spread function of a display panel without a functional layer.
Figure 4B:
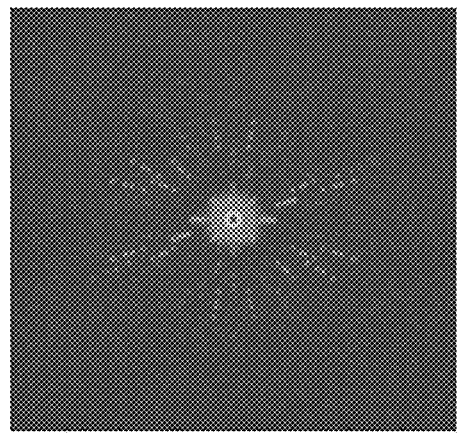
FIG. 4B is a schematic view showing the simulation of a point spread function of a display panel with a hole transport layer as a functional layer according to an embodiment of the present disclosure.

FIG. 4A is a schematic view showing the simulation of a point spread function of a display panel without a functional layer. FIG. 4B is a schematic view showing the simulation of a point spread function of a display panel with a hole transport layer as a functional layer according to an embodiment of the present disclosure.

The point spread function may represent the distribution of the light intensity of diffused light after imaging of a point light source and may represent the size of diffraction. It can be seen from FIG. 4A and FIG. 4B that the diffraction of light is reduced in the display panel with a functional layer.

Figure 5A:
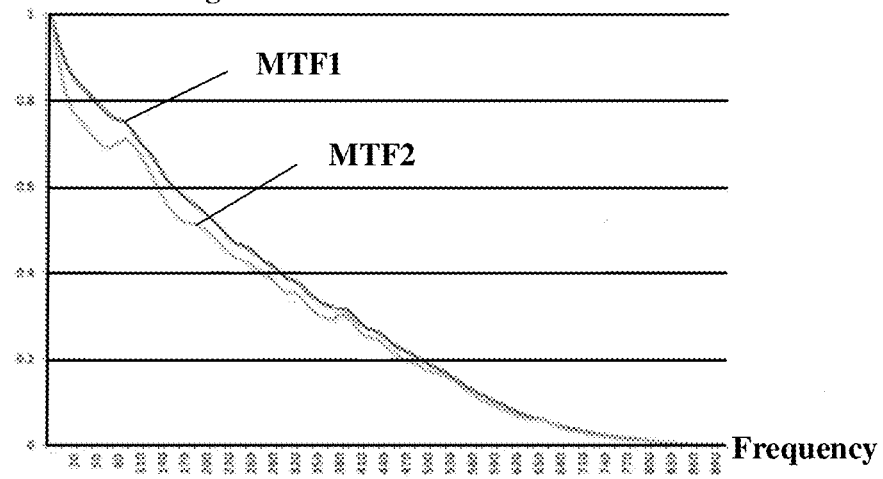
FIG. 5A is a schematic view showing the simulation of a modulation transfer function of the meridian plane according to some embodiments of the present disclosure.
Figure 5B:
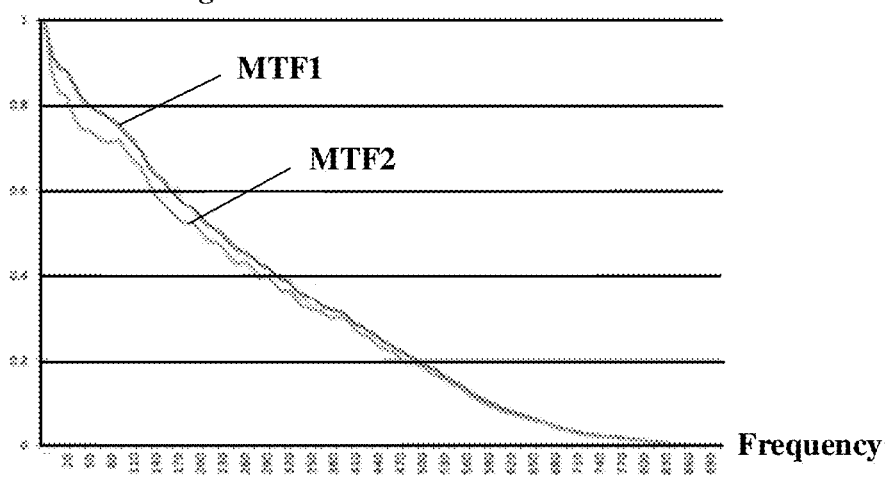
FIG. 5B is a schematic view showing the simulation of a modulation transfer function of the sagittal surface according to some embodiments of the present disclosure.

FIG. 5A is a schematic view showing the simulation of a modulation transfer function of the meridian plane according to some embodiments of the present disclosure. FIG. 5B is a schematic view showing the simulation of a modulation transfer function of the sagittal surface according to some embodiments of the present disclosure.

In FIG. 5A and FIG. 5B, MTF1 represents the modulation transfer function of the display panel without a functional layer, and MTF2 represents the modulation transfer function of the display panel with the hole transport layer as the functional layer.

The modulation transfer function represents the resolution at different spatial frequencies. It can be seen from FIG. 5A and FIG. 5B that, the diffraction of light is reduced, and the resolution is improved in the display panel with a functional layer.

As can be seen from FIG. 4A, FIG. 4B, FIG. 5A, and FIG. 5B, the display panel of embodiments of the present disclosure may effectively improve the imaging resolution of light rays, thereby alleviating the problem of glare in camera imaging and improving the quality of the camera imaging.

Figure 6:
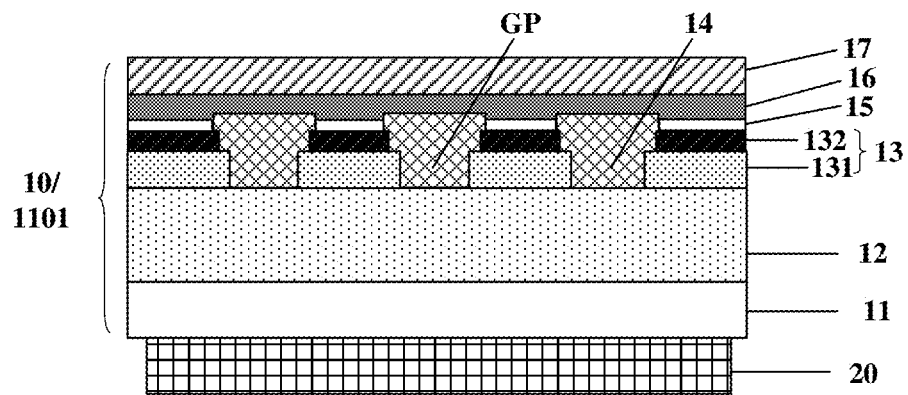
FIG. 6 is a schematic cross-sectional view showing a display device according to an embodiment of the present disclosure.

FIG. 6 is a schematic cross-sectional view showing a display device according to an embodiment of the present disclosure.

As shown in FIG. 6, the display device may comprise the display panel 10 according to any one of the above-described embodiments. In some embodiments, referring to FIG. 6, the display device further comprises a camera 20 located on one side of the base substrate 11 away from the driving circuit layer 12. The orthographic projection of the camera 20 on the base substrate 11 at least partially overlaps with the first display area 1101. For example, the orthographic projection of the camera 20 on the base substrate 11 is within the first display area 1101.

In some embodiments, the display device may be, for example, any product or component that has a display function, for example, a mobile terminal (for example, a smart phone, or a tablet computer), a television, a monitor, a notebook computer, a digital photo frame, a navigator, or an electronic paper, etc.

Figure 7:
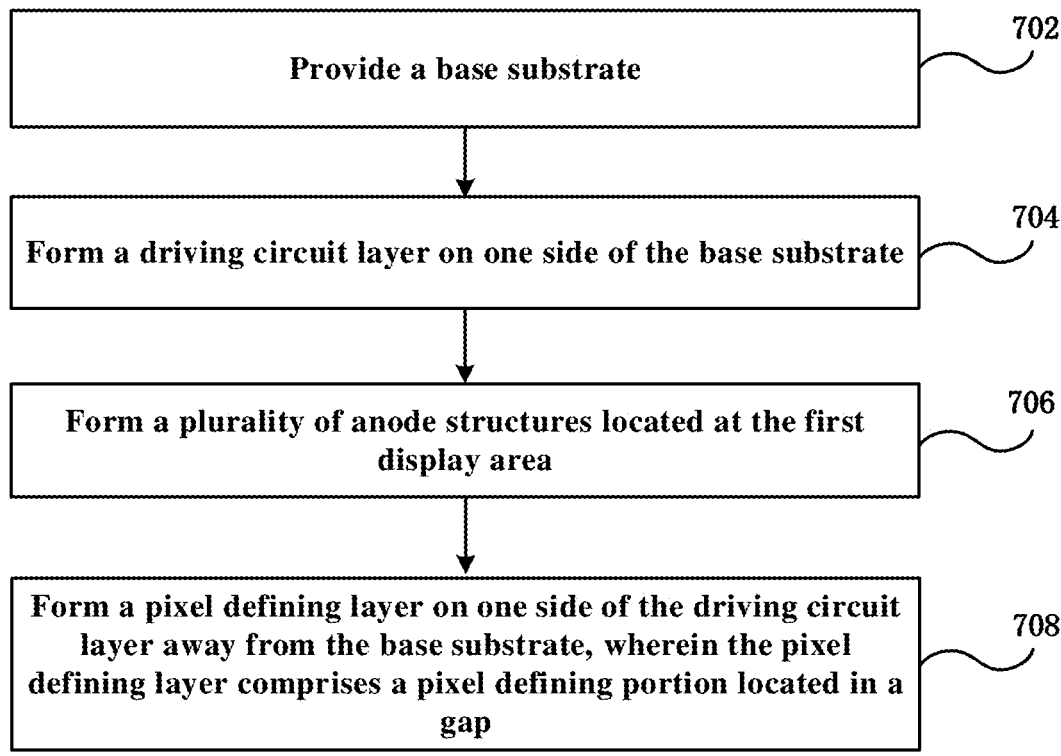
FIG. 7 is a schematic flowchart showing a manufacturing method of a display panel according to an embodiment of the present disclosure.

FIG. 7 is a schematic flowchart showing a manufacturing method of a display panel according to an embodiment of the present disclosure. Here, the display panel comprises a display area comprising a first display area and a second display area other than the first display area. The transmittance of the first display area is smaller than that of the second display area.

At step 702, a base substrate is provided. It should be understood that the base substrate is located at both the first display area and the second display area.

At step 704, a driving circuit layer located at the first display area and the second display area is formed on one side of the base substrate.

Here, the driving circuit layer comprises a pixel driving circuit for driving a light-emitting device.

At step 706, a plurality of anode structures located at the first display area is formed. A gap is provided between adjacent anode structures of the plurality of anode structures.

At least one of the plurality of anode structures may be formed by the following way.

First, a functional layer is formed on one side of the driving circuit layer away from the base substrate. For example, a functional material layer may be formed on one side of the driving circuit layer away from the base substrate, and then is patterned by using a mask to form the functional layer.

Then, a first anode is formed on one side of the functional layer away from the base substrate. Here, the first orthographic projection of the functional layer on the base substrate comprises a portion that does not overlap with the second orthographic projection of the first anode on the base substrate.

At step 708, a pixel defining layer is formed on one side of the driving circuit layer away from the base substrate. Here, the pixel defining layer comprises a pixel defining portion in a gap between adjacent anode structures.

The formed display panel satisfies the following condition: −0.1 microns≤d1−d2≤0.1 microns. d1 is the thickness of the functional layer, and $$d2 = \frac{\lambda(2m+1)}{2|n1-n2|}.$$

n1 is the refractive index of the functional layer, n2 is the refractive index of the pixel defining portion, |n1−n2| is the absolute value of (n1−n2), λ is the wavelength of visible light, and m is an integer.

In the above-described embodiments, −0.1 microns≤d1−d2≤0.1 microns. The diffraction of external light transmitted through the gap GP between adjacent first anodes 132 is at least reduced, which helps to improve the imaging resolution of light, thereby alleviating the problem of glare in camera imaging and improving the quality of the camera imaging.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalent substitution of part of the technical features can be made without departing from the scope and spirit of the present disclosure. The scope of the disclosure is defined by the following claims.

What is claimed is:

1. A display panel comprising a display area, wherein the display area comprises a first display area and a second display area other than the first display area, and a transmittance of the first display area is smaller than that of the second display area, the display panel comprising:
   a base substrate;
   a driving circuit layer located on one side of the base substrate and located at the first display area and the second display area;
   a plurality of anode structures located at the first display area, wherein a gap is provided between adjacent anode structures of the plurality of anode structures, and at least one of the plurality of anode structures comprises:
      a functional layer located on one side of the driving circuit layer away from the base substrate, and
      a first anode located on one side of the functional layer away from the base substrate, wherein a first orthographic projection of the functional layer on the base substrate comprises a portion that does not overlap with a second orthographic projection of the first anode on the base substrate; and
   a pixel defining layer located on one side of the driving circuit layer away from the base substrate, and comprising a pixel defining portion located in the gap, wherein:

−0.1 microns≤d1−d2≤0.1 microns, wherein d1 is a thickness of the functional layer, and $$d2 = \frac{\lambda(2m+1)}{2|n1-n2|},$$

wherein n1 is a refractive index of the functional layer, n2 is a refractive index of the pixel defining portion, |n1−n2| is an absolute value of (n1−n2), λ is a wavelength of visible light, and m is an integer.

2. The display panel according to claim 1, wherein the second orthographic projection is within the first orthographic projection.

3. The display panel according to claim 1, wherein:
   the functional layer comprises a first surface away from the base substrate, a second surface close to the base substrate, and a third surface adjacent to the first surface and the second surface; and
   the pixel defining portion is in contact with at least a part of an area of the first surface not covered by the first anode, and in contact with the third surface.

4. The display panel according to claim 1, wherein λ ranges from 500 nanometers to 600 nanometers.

5. The display panel according to claim 4, wherein λ=550 nanometers.

6. The display panel according to claim 1, wherein m=0.

7. The display panel according to claim 1, wherein the functional layer has a thickness of 0.2 microns to 5 microns.

8. The display panel according to claim 2, wherein a minimum distance between an edge of the second orthographic projection and an edge of the first orthographic projection is 1 micron to 3 microns.

9. The display panel according to claim 8, wherein a shape of the second orthographic projection is the same as that of the first orthographic projection.

10. The display panel according to claim 1, wherein |n1−n2| is greater than or equal to 0.15.

11. The display panel according to claim 1, wherein an extinction coefficient of the functional layer is k, where 0≤k≤0.5.

12. The display panel according to claim 11, wherein 0≤k≤0.1.

13. The display panel according to claim 1, wherein d1=d2.

14. The display panel according to claim 1, wherein a material of the functional layer comprises a silicon nitride, a carbazole compound, an organic amine compound, or a butadiene compound.

15. The display panel according to claim 1, wherein the first anode is opaque.

16. The display panel according to claim 15, wherein the first anode comprises a stack comprising a first layer, a second layer, and a third layer located between the first layer and the second layer, and a material of each of the first layer, the second layer, and the third layer comprises a metal or a metal oxide.

17. The display panel according to claim 1, further comprising:
a plurality of second anodes located at the second display area and in contact with a planarization layer in the driving circuit layer.

18. The display panel according to claim 1, wherein the driving circuit layer comprises:
a pixel driving circuit connected to the first anode and located at the second display area.

19. A display device, comprising:
the display panel according to claim 1; and
a camera located on one side of the base substrate away from the driving circuit layer, wherein an orthographic projection of the camera on the base substrate at least partially overlaps with the first display area.

20. A manufacturing method of a display panel, wherein the display panel comprises a display area comprising a first display area and a second display area other than the first display area, and a transmittance of the first display area is smaller than that of the second display area, the manufacturing method comprising:
providing a base substrate;
forming a driving circuit layer located at the first display area and the second display area on one side of the base substrate;
forming a plurality of anode structures located at the first display area, wherein a gap is provided between adjacent anode structures of the plurality of anode structures, wherein forming at least one of the plurality of anode structures comprises:
forming a functional layer on one side of the driving circuit layer away from the base substrate, and
forming a first anode on one side of the functional layer away from the base substrate, wherein a first orthographic projection of the functional layer on the base substrate comprises a portion that does not overlap with a second orthographic projection of the first anode on the base substrate; and
forming a pixel defining layer on one side of the driving circuit layer away from the base substrate, wherein the pixel defining layer comprises a pixel defining portion located in the gap, wherein:

$-0.1$ microns $\leq d1-d2 \leq 0.1$ microns, wherein d1 is a thickness of the functional layer, and $$d2 = \frac{\lambda(2m+1)}{2|n1-n2|},$$

wherein n1 is a refractive index of the functional layer, n2 is a refractive index of the pixel defining portion, $|n1-n2|$ is an absolute value of (n1−n2), $\lambda$ is a wavelength of visible light, and m is an integer.

* * * * *